United States Patent [19]

Coppen

[11] 3,892,609

[45] July 1, 1975

[54] PRODUCTION OF MIS INTEGRATED DEVICES WITH HIGH INVERSION VOLTAGE TO THRESHOLD VOLTAGE RATIOS

[75] Inventor: Peter J. Coppen, Newport Beach, Calif.

[73] Assignee: Hughes Aircraft Company, Culver City, Calif.

[22] Filed: June 24, 1974

[21] Appl. No.: 482,046

Related U.S. Application Data

[63] Continuation of Ser. No. 187,255, Oct. 7, 1971, abandoned.

[52] U.S. Cl. ................ 148/188; 148/175; 148/187; 148/190; 357/23

[51] Int. Cl.² .............................................. H01L 7/34

[58] Field of Search ........... 148/188, 187, 175, 190; 357/23

[56] References Cited

UNITED STATES PATENTS

| | | | |
|---|---|---|---|
| 3,600,647 | 8/1971 | Gray | 148/187 X |
| 3,608,189 | 9/1971 | Gray | 148/187 X |
| 3,700,507 | 10/1972 | Murray | 148/187 |
| 3,730,787 | 5/1973 | Murphy et al. | 148/187 X |
| 3,752,711 | 8/1973 | Kooi et al. | 148/187 X |
| 3,753,806 | 8/1973 | Adamic | 148/188 |

*Primary Examiner*—G. Ozaki
*Attorney, Agent, or Firm*—Joseph E. Szabo; W. H. MacAllister, Jr.

[57] ABSTRACT

Field inversion around MIS devices in a semiconducting substrate is inhibited by forming a doped oxide layer around the devices, with the layer containing impurities of the same conductivity type as that of the substrate. The substrate and the oxide layer are then heated, thereby diffusing impurities from the layer into the substrate surface and raising the voltage necessary to cause field inversion therein.

5 Claims, 20 Drawing Figures

Figures 1, 2A, 2B, 2C, 2D:
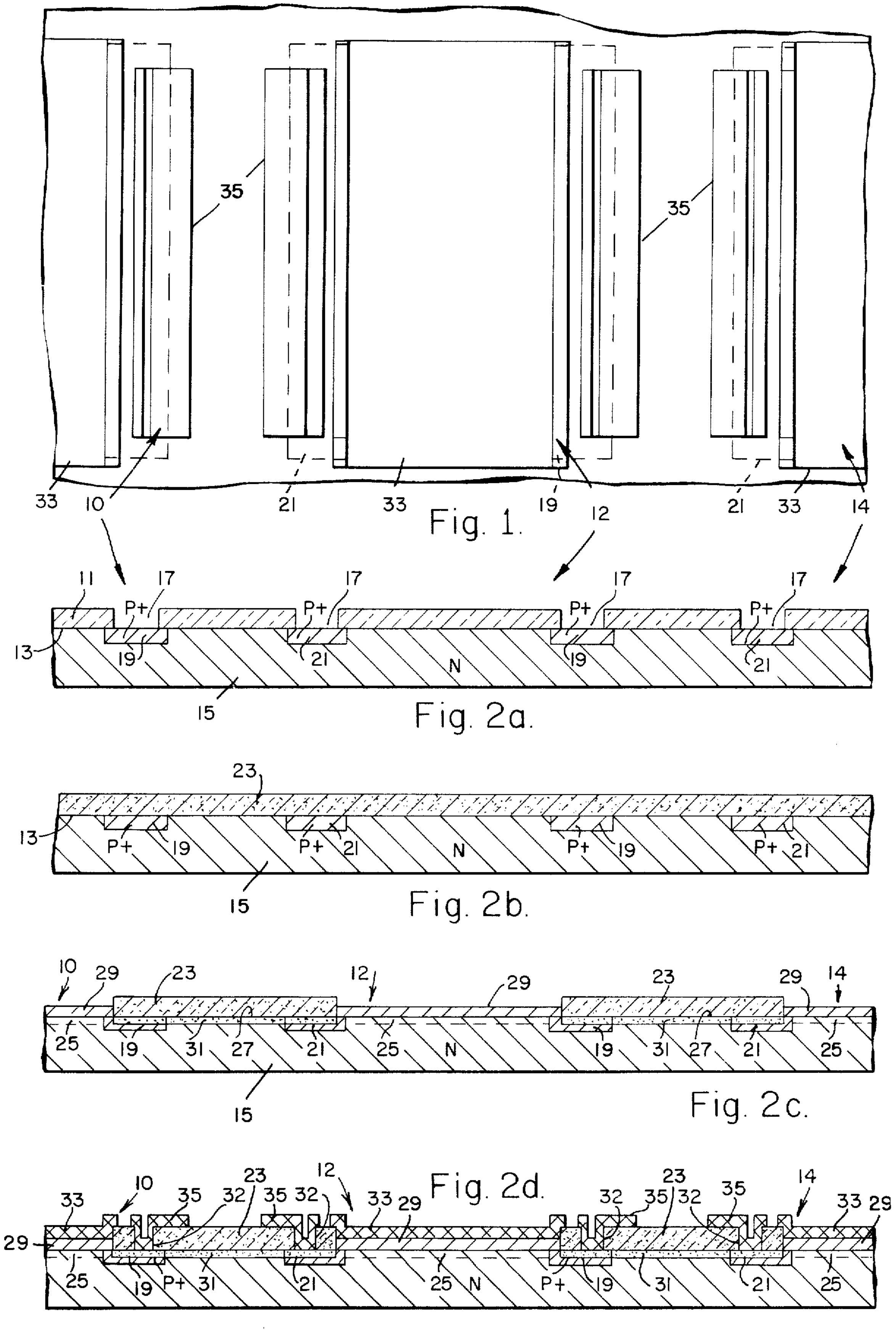

PRODUCTION OF MIS INTEGRATED DEVICES WITH HIGH INVERSION VOLTAGE TO THRESHOLD VOLTAGE RATIOS

This is a continuation of application Ser. No. 187,255, filed Oct. 7, 1971, now abandoned.

The present invention relates to semiconductor devices of the type wherein relatively heavily doped regions of a given conductivity type are closely spaced at the surface of a lightly doped substrate of the opposite conductivity type, with an insulating layer covering the surface of the substrate between them, on top of which layer an electrical potential is exerted either by a conductor or by electric charges distributed on the surface of the insulator. Under these conditions, the electric potential on top of the insulating layer may have the effect of inverting the substrate surface to the same conductivity type as that of the heavily doped spaced apart regions, thus allowing undesirable currents to flow between the heavily doped regions. The present invention is directed to diminishing this effect.

The above effect is particularly serious in MISFET integrated circuits, which comprise a plurality of metal-insulator-semiconductor (MIS) devices formed in a common semiconducting wafer or substrate. Typically, such integrated circuits include many pairs of relatively highly doped regions at the surface of a relatively lightly doped semiconducting substrate, these regions having a conductivity type which is the opposite of that of the substrate. A thin (approximately 1,200 A) insulating layer called the "gate insulator" is formed on the surface of the substrate between each pair of doped regions and a conducting gate electrode is deposited upon the insulating layer. Metal electrodes are connected to the doped regions, one of which is called the "source" and the other the "drain." Current flows from the source to the drain through a conductive layer, called a "channel," which is induced at the surface of the semiconductor by a potential applied to the gate electrode, with the magnitude of the current for a given source-to-drain voltage being modulated by the gate potential. The area of the common substrate between adjacent MIS devices is covered by a relatively thick (typically 1 to 2 microns) insulating layer, called the "field insulator." The formation of an invention layer under the field insulator is called "field inversion." While not necessarily so, it will be assumed for purposes of this discussion, that the substrate is N-type silicon, the relatively heavily doped regions are of P-type conductivity, and the gate and field insulators are silicon dioxide, being referred to herein as the "gate oxide" and "field oxide, " respectively. Such a device is commonly referred to as a metal-oxide-semiconductor (MOS) and will be so referred to herein.

The presence of an inversion layer between adjacent MOS devices gives rise to undesirable leakage currents between them. Field inversion in MOS integrated circuits may be caused by conductors which are deposited on the field oxide between adjacent MOS devices and which serve to apply operating voltages to various ones of the devices. Alternatively, field inversion may also come about due to the accumulation of electric charge on the field oxide.

Several methods have been employed to raise the voltage at which field inversion will occur. One of them has been to make the field oxide considerably thicker than the gate oxide. A second method is to diffuse a dopant under the field oxide in well-defined areas which do not touch the source and drain regions so as to create between adjacent MOS devices a barrier to the flow of current between them.

The first of the above methods, called the "thick oxide" process, is the one most commonly used. Its shortcoming is that the relatively great thickness of the field oxide, as compared to the gate oxide, increases the probability of metal conductors breaking at the point where they pass over a large step in the oxide, this step occurring at the point where the field oxide and the gate oxide meet. The reason why the field oxide is much thicker than the gate oxide is that a typical MOS circuit it is desirable that the gate threshold voltage be as low as possible and that the field inversion voltage be higher than the maximum desired power supply voltage to be applied to the circuit. The desired ratio between field inversion and gate threshold voltages may be as high as 15, which would require a 15:1 ratio between the relative thicknesses of the field and gate oxides.

The second method is often referred to as the "channel stopper" method because the field inversion in effect creates a channel between adjacent MOS devices in the substrate and the formation of a doped strip between adjacent such devices has the effect of breaking the continuity of the channel formed between them. The disadvantage of the latter method is that its use increases the space which must be left between adjacent devices, due to the fact that the heavily doped channel stopper region must not contact the source or drain regions of the MOS devices between which the channel stopper region lies. The reason why the channel stopper region must not contact the source or drain regions is that if it did, it would reduce the junction breakdown voltage between those regions and the substrate due to the relatively heavy doping of the channel stopper region. Such a region is usually formed by conventional doping techniques in which a selected portion of the substrate surface between adjacent devices is exposed to a gas at an elevated temperature and containing conductivity determining impurities. If the channel stopper region made by such a process were extended into contact with the source and drain regions of the devices between which it extends and an attempt were made to prevent device junction breakdown by reducing the level of doping of the channel stopper region, the attempt would in all probability fail or be extremely difficult to implement because of the relatively high concentration at which dopants are diffused by the above direct diffusion process.

A third solution to the inversion problem is described in patent application Ser. No. 116,785 filed by Kenneth G. Aubuchon Feb. 2, 1971, now abandoned for Electrically Charged Insulator On A Semiconductor Substrate, and assigned to the assignee of the present invention. As described in the referenced patent application, an electric charge is selectively introduced into those portions of the insulating layer on the surface of a semiconducting substrate under which inversion is to be prevented, the sign of the electric charge being the opposite of the sign of the majority carriers in the substrate. Thus in the case of an MOS integrated circuit, the electric charge so introduced is confined to the field insulator. A charge is not introduced into the gate insulator since this would increase the gate threshold voltage.

Yet another approach to the invention problem is disclosed in patent application Ser. No. 168,713 filed on Aug. 31, 1971, now U.S. Pat. No. 3,748,187 by Aubuchon, Dill and Bower for Self-Registered Doped Layer For Preventing Field Inversion In MIS Circuits and assigned to the assignee of the present invention. In accordance with the technique described in the referenced patent application, the field oxide is recessed into the surface of the substrate, with the channel-stopping region remaining under it, and hence being substantially below the substrate's surface. Preferably the field oxide extends to a greater depth into the substrate than do the diffusions next to it and extends laterally beyond the channel-stopping region by a precisely determinable amount, thereby providing secure separation of the channel-stopping region from the adjacent diffusions without requiring excessive space to do so.

One of the objects of the present invention is to raise the field inversion voltage of an integrated circuit having closely spaced field effect devices thereon, without increasing the spacing between such devices.

Another object of the invention is to provide an alternative technique for raising the field inversion voltage of an integrated circuit without raising its gate threshold voltage and without increasing the thickness of its field oxide.

A more specific object of the present invention is to increase, by a precise amount, the doping of the semiconducting substrate surface surrounding each MOS device in a substrate so as to increase thereby the voltage necessary to invert that surrounding substrate surface without raising the gate threshold voltages necessary to operate those devices and without causing premature device junction breakdown. A closely related object of the invention is to develop a technique whereby oppositely doped portions of a substrate containing complementary MOS devices may have their surfaces further treated so as to increase the doping of those surfaces by precise amounts around the MOS devices contained therein, so as to raise, for all such devices, the voltage necessary to invert the substrate surface which extends between and around them.

In accordance with the invention these and other objects are attained by applying an impurity-containing oxide layer to the field regions around each MOS device contained in a given substrate and heating the substrate, thereby raising the doping of those regions. This is in contrast to the known technique whereby the active regions of a semiconductive device are formed by means of a doped oxide layer, as disclosed for example in Brixey et al. U.S. Pat. No. 3,354,008 and Hofstein U.s. Pat. No. 3,434,021. More particularly, in accordance with the present invention doping is accomplished by depositing on the substrate surface, contiguously adjacent to the positions of the source and drain regions of the MOS devices, an oxide layer doped with the same conductivity type impurity as that of the substrate. An opening is provided in the oxide layer to expose the substrate surface between the source and the drain positions where the channel regions are to be. The substrate and the oxide layer thereon are then heated, thereby diffusing the impurities from the oxide layer into the substrate surface. In the case of a substrate containing MOS devices of the same conductivity type only, the technique may be implemented by use of a single oxide layer doped with impurities of the same conductivity type as that of the substrate. This oxide layer is applied on the entire substrate surface, extending even over the source and drain regions previously formed therein, thereby slightly counterdoping them.

Alternatively, with the same type of device, a two-oxide technique may be employed. With the latter technique, two oxide layers are formed in succession on a substrate surface in which the source and drain regions have not yet been formed. The oxide layers contain impurities of opposite conductivity types, with one of the oxide layers serving as the means by which to form the source and drain regions and the other oxide layer serving as the means by which the field regions surrounding the source and drain regions are doped. Thus, the two-oxide layers carrying the opposite conductivity type impurities are so patterned on the substrate surface that one of them extends over those areas of the substrate surface where the source and drain regions are to be formed and the other oxide layer extends over the remaining area of the substrate, thereby surrounding each pair of source and drain regions, or more precisely, the oxide layer for forming those regions. With the two oppositely doped oxide layers formed on the substrate surface, the entire assembly is then heated, causing the impurities from both of the oxide layers to be diffused into the substrate surface simultaneously, thereby concurrently forming in the substrate surface both the source and drain regions and the increased conductivity field regions in the substrate surrounding them. The principal difference between the two-layer and the single-layer implementation of the present invention is that with the two-layer technique there is no counterdoping of the source and drain regions.

Both the single layer and double layer technique can be applied to complementary MOS devices in which opposite conductivity type regions in a common substrate contain opposite conductivity type MOS devices. Briefly, in the case of the single layer implementation of the invention there are actually two oxide layers used, each serving to increase the conductivity of the field region in a respective portion of the substrate surface, those portions, as stated before, having opposite conductivity types. Moreover, each such portion includes at least one pair of spaced apart source and drain regions which have been doped to acquire a conductivity type opposite that of the substrate portion in which they are contained. Thus, the substrate will include first and second conductivity type portions disposed along a common surface of a semiconductive substrate, with the respective portions containing pairs of source and drain regions whose conductivity type is opposite that of the respective substrate portions in which they are contained. On this substrate there are then deposited first and second oxide layers, with the first layer containing first conductivity type impurities and extending over the first conductivity type portion and the second type layer extending over the entire substrate surface and containing second conductivity type impurities. Openings are then formed through the oxide layers so as to remove them from those portions of the substrate surface where the channels between respective source and drain regions are to exist. The entire assembly is then heated, causing the impurities from both layers to be diffused into the substrate surface. As a result the substrate surface in the first conductivity type portion receives additional doping around the source and drain regions therein and the same phenomenon also occurs in the second conductivity type substrate portion, it receiving additional doping from the second oxide layer.

A method analogous to the two-oxide layer previously described can also be employed for raising the field inversion voltage of complementary MOS devices. Where this technique is employed, the process begins with a substrate having opposite conductivity type portions in which the source and drain regions have not yet been formed. On this substrate surface there is then formed a pattern which includes four oxide layers. First and second oxide layers extend over the first and second conductivity type portions, respectively, the layers containing second and first conductivity type impurities respectively and each comprising two spaced apart portions between which the substrate surface is exposed. These two layers will serve to form the source and drain regions for the opposite conductivity type MOS devices which are to be formed in the substrate. Also forming part of the oxide layer pattern is a third oxide layer which contains a first conductivity type impurity over the first conductivity type substrate portion and which is contiguously adjacent to and surrounds the first oxide layer. The fourth oxide layer contains a second conductivity type impurity, extends over the second substrate portion and is contiguously adjacent to and surrounds the second oxide layer. The function of the third and fourth oxide layers is to form the increased conductivity field regions surrounding the MOS devices in the first and second substrate portions. With the four oxide layers formed on the substrate, the entire assembly is heated, causing the impurities from the four layers to diffuse into the substrate surface so as to create therein respective source and drain pairs under the first and second oxide layers, surrounded by respective doped field regions under the third and fourth oxide layers.

A principal advantage of the present invention is that it provides a means for closely controlling the total amount of impurities which are diffused into the substrate surface, thus permitting the increased conductivity layer formed in the substrate surface to extend right up to the source and drain regions of the MOS devices in the substrate without reducing their junction breakdown voltage excessively. The close control over the amount of impurities is due to the fact that the intermediate step whereby the impurities are first incorporated into the oxide layer which is then heated to diffuse into the substrate whatever impurities were in the oxide layer produces a diluting effect. Thus the total amount of impurities which are initially incorporated into the oxide layer may be limited within reasonably accurate limits so that, when during the subsequent step of heating, the impurities diffuse into the substrate surface, the amount of such diffused impurities may be kept below that level which would cause premature junction breakdown to occur, while being kept above the minimum level required to raise the field inversion voltage to a satisfactory figure.

The invention will be described in greater detail by reference to the drawings in which:

FIG. 1 is a plan view of a portion of a semiconducting substrate containing a plurality of closely spaced MOS devices between which the field regions have been doped in accordance with the present invention;

FIGS. 2*a–d* are cross-sectional elevational views illustrating the device of FIG. 1 at successive stages of its fabrication;

FIGS. 3*a–d* are cross-sectional elevational views of an MOS integrated circuit in various stages of fabrication and in which both the source and drain regions and the surrounding doped field regions are formed by the use of impurity-containing oxide layers;

FIGS. 4*a–e* are cross-sectional elevational views of a complementary MOS integrated circuit in successive stages of fabrication, in which the doped oxide layers are formed on a substrate wherein the source and drain regions have already been formed;

FIGS. 5*a–f* are cross-sectional elevational views of a complementary MOS integrated circuit in various stages of fabrication in which the source and drain regions as well as the doped field regions surrounding them are formed by doped oxide layers.

Referring now to the figures, the steps involved in fabricating an integrated circuit, having a plurality of MOS devices 10, 12, and 14 of a given conductivity type, in accordance with the present invention are depicted in FIGS. 2*a–d*. In the following discussion of FIGS. 2*a–d* it will be assumed that P-channel devices are to be formed in an N conductivity type substrate, and that the substrate material is silicon. It will be understood, however, that the technique can be also applied to producing N-channel devices in a P conductivity type substrate as well, and that other substrate materials, such as germanium for example may be used. The source and drain regions of the MOS devices may be conventionally formed by the well-known oxide mask process. As shown in FIG. 2*a*, an oxide layer 11 is thermally grown on the surface 13 of an N conductivity-type silicon wafer 15. By conventional masking techniques openings 17 are formed in the oxide layer 11 after which the wafer is placed in a diffusion furnace at 1,050°C, with diborane and oxygen flowing together with a nitrogen carrier. The process is continued until boron has diffused through the openings 17 into the substrate 15 to an appropriate depth to form the doped P+ conductivity type source and drain regions 19 and 21.

Following the diffusion step the oxide 11 is completely stripped from the substrate 15 by immersion of the latter in hydrofluoric acid and an oxide layer 23 doped with an N-type impurity such as phosphorus is deposited on the substrate surface 13 (FIG. 2*b*).

Using conventional masking techniques, the deposited oxide layer 23 is removed in those areas where channel regions 25 are desired between respective pairs of source and drain regions 19 and 21. This leaves a pattern of doped oxide 23 which extends over the field regions 27 of the substrate surface between the respective MOS devices 10, 12 and 14 (FIG. 2*c*). It will be noted that the patterned oxide layer 23 also extends over and interfaces with those portions of the substrate surface in which the source and drain regions 19 and 21 were formed.

The wafer is then placed in a wet oxygen atmosphere at an elevated temperature, suitably 925°C, in order to grow a silicon dioxide layer 29 over the substrate surface 13 left exposed by the last masking step. The layer 29 serves as the gate oxide of the MOS devices 10, 12 and 14. This step also serves to diffuse the impurities from the doped oxide layer 23 into the silicon substrate 15, thereby forming therein the regions 31 which extend over the entire field region 27 of the substrate, and which in accordance with the invention has a higher conductivity than the underlying portion of the substrate. While it is desirable to combine the diffusing and gate oxide forming steps, they need not be. Instead, diffusion may be performed in an inert atmosphere after which the gate oxide may be separately formed.

It will be noted that impurities from the patterned oxide layer 23 are diffused not only to the field regions 27 of the substrate where they are desired in order to raise the field inversion voltage of the device, but that they also diffuse into the source and drain regions 19 and 21 of the devices. However, this does not create a problem because the source and drain regions are sufficiently heavily doped that their functions are not disturbed by the slight counterdoping from the doped oxide 23. Recognition of this fact permits one to take advantage of a resulting simplification in the masking by which the patterned oxide layer 23 is produced. In particular, the patterned oxide 23 need not be precisely positioned since it is immaterial how far it overlaps the source and drain regions 19 and 21. Yet, by allowing some overlap to occur, one can ensure that the patterned oxide layer 23 and the doped layer 31 formed under it are contiguously adjacent to the source and drain regions so that the protection afforded by the doped regions 31 extends over the entire field region 27 of the device.

To complete the MOS devices 10, 12 and 14 contact openings 32 are cut in the oxide layer 23 (assuming that it extends substantially over the source and drain regions) and a layer of metal is then applied over the oxide layers 23 and 29. Those portions of the metal layer which lie on the thermally grown oxide layer 29 form gate electrodes 33 of the respective MOS devices 10, 12 and 14. The remaining portions of the metal layer 33 which extend down to the source and drain regions 19 and 21 through the openings 31 form contacts 35 for the respective devices. The resulting integrated circuit containing the three illustrated MOS devices 10, 12 and 14 is shown in plan view in FIG. 1 where it may be seen that each of the MOS devices 10, 12 and 14 is completely surrounded with the doped surface layer 31 which extends contiguously adjacent to the source and drain regions 19 and 21 of those devices.

Turning now to a more detailed consideration of the manner in which a suitably doped oxide layer may be formed on the semiconducting substrate, let it be assumed again that the substrate is silicon doped to have N-type conductivity and that the oxide layer is silicon dioxide which is to be doped with phosphorus, an impurity which causes a negative type conductivity in a semiconductor. To form the layer 23, the substrate, in the condition in which it is shown in FIG. 2*a* but with the oxide layer 11 removed, is placed on a quartz slab disposed on a heating element in an open glass tube. A gas mixture containing silane ($SiH_4$), oxygen, and phosphine ($PH_3$) combined with a suitable carrier gas such as nitrogen is passed through the glass tube after the substrate 15 has reached a temperature between approximately 400°C and 450°C. The silane and oxygen react to form a silicon dioxide layer on the substrate surface and the phosphine reacts with the oxygen to furnish the phosphorus impurities in the dioxide layer. The substrate temperature may rise as high as 600°C without adversely affecting the process. However, the higher the temperature the shorter must be the time during which the silicon dioxide layer is formed, in order to prevent premature diffusion of a significant number of phosphorus impurities from the silicon dioxide layer into the substrate.

The permissible range of impurity concentration in the silicon dioxide layer is determined by two factors. The minimum permissible concentration is determined by the minimum desired field inversion voltage. The maximum permissible impurity concentration on the other hand is determined by the lowest tolerable breakdown voltage for the P-N junctions which are ultimately formed in the substrate between respective ones of the source and drain regions 19 and 21 and the doped substrate surface layer 31 which is ultimately formed contiguously adjacent thereto as seen in FIG. 2*c*.

Typical concentrations used in forming the doped oxide layer 23 on an N-type conductivity silicon substrate heated to 470°C is as follows:

Nitrogen: 78 liters per minute
Oxygen: 237 milliliters per minute
10% silane by volume in nitrogen: 260 milliliters per minute
0.1% phosphine by volume in nitrogen: 340 milliliters per minute The gaseous mixture comprised of the above ingredients is made to flow over the heated substrate for 30 seconds to create an impurity-containing sublayer of approximately 275 A. The remainder of the layer may be built up with or without the incorporation of further impurity. Thus, once the impurity-containing sublayer has been formed, the flow of phosphine may be shut off while the formation of the oxide layer 23 continues without the addition of phosphine until the oxide layer has built up to a thickness of up to approximately 20,000 A, and preferably between 8,000 A and 12,000 A. The maximum total thickness of the oxide layer is limited not by the requirements of the invention but by mechanical considerations which will become evident as this description proceeds.

The foregoing process described with reference to FIGS. 2*a–d* was seen to be characterized by the fact that the doped oxide layer was used only for raising the conductivity of the field regions of the substrate surface surrounding the MOS devices which were formed in the substrate by conventional means. The next exemplary implementation of the invention differs basically from that of FIGS. 2*a–d* in that both the MOS devices, and in particular their source and drain regions, as well as the surrounding increased conductivity field regions are formed by doped oxide layers. The difference in result is that, whereas in the first described implementation of the invention the doped oxide layer extends over, and causes counterdoping of, the previously formed source and drain regions, this does not occur in the next to be described series of steps because the two doped oxide layers make contact with the substrate surface at contiguously adjacent portions thereof.

Figure 3A:
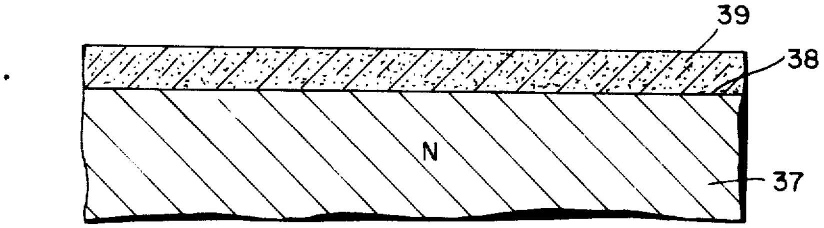
Figure 3B:
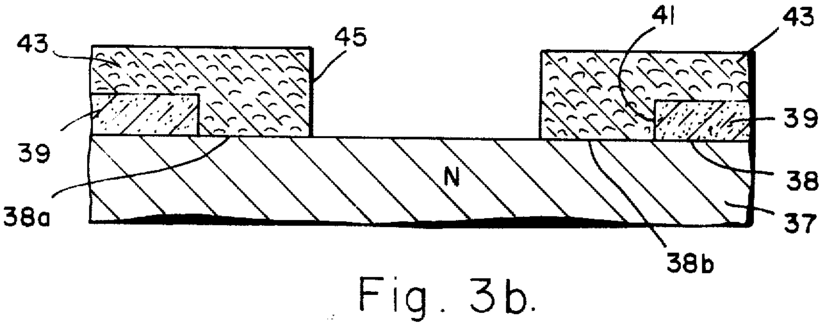

Turning now to FIGS. 3*a–d* and considering the series of steps illustrating therein in general at first, there is first formed on a semiconducting substrate 37 having a given conductivity type an oxide layer doped to have the same conductivity type. As was the case with the steps discussed with reference to FIGS. 2*a–d*, it will be assumed for purpose of discussion that the substrate 37 is silicon having N-type conductivity and that therefore the doped oxide layer 39 is also doped to have N-type conductivity. The eventual purpose of the doped oxide layer 39 is to raise the conductivity of the substrate 37 around the MOS device which will eventually be formed therein. For this purpose an opening 41, typically rectangular, is next cut by conventional means in the doped oxide layer 39, and a second oxide layer 43 doped to have the opposite, P-type conductivity impurities is formed, this layer extending through the opening 41 to interface with the substrate surface 38 in a rectangular pattern (FIG. 3*b*). The function of the second doped oxide layer 43 is to form the P conductivity source and drain regions in the substrate. Next an opening 45 is cut through the second doped oxide layer 43, leaving two oxide strips interfacing with the substrate surface 38 at 38*a* and 38*b*, lying along opposite edges of the window 41. Thus, along the substrate surface 18, the first oxide layer 39 completely surrounds the outside borders of the second oxide layer 43, which forms two spaced apart portions between which the substrate surface 38 is exposed and where the channel region of the MOS device is to be situated. In that region, of course, the original doping of the substrate 37 is to be left undisturbed.

Figure 3C:
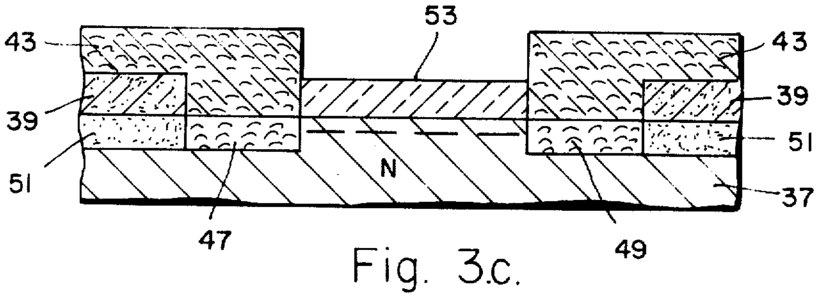

With the first and second oxide layers 39 and 41 properly patterned, the substrate 37 is placed in an atmosphere at an elevated temperature sufficient to cause the impurities contained in the layers 39 and 43 to diffuse into the substrate. Thus, the impurities from the second layer 43 diffuse into the substrate 37 to form a pair of spaced apart source and drain regions 47 and 49 and the impurities contained in the first oxide layer 39 diffuse at the same time to produce the doped field regions 51 surrounding the source and drain regions and having an increased N-type conductivity. If desired, the atmosphere may include an oxidizer so as to cause a silicon oxide layer 53 to grow on the substrate surface 38 between the doped source and drain regions 47 and 49 during the same step (FIG. 3*c*).

Finally, by conventional means, openings 55 are cut through that portion of the second oxide layer 43 which extends over the source and drain regions 47 and 49 so as to expose the substrate surface 38 containing them. A metal layer is then deposited again by conventional means on top of the second oxide layer 43 extending into contact with the source and drain regions 47 and 49 and also interfacing with the gate oxide layer 53. The metal layer is then cut into sections so as to form separate source and drain contacts 57 and a gate electrode 59.

Turning now to some of the details of the manner in which the doped oxide layers 39 and 43 are formed in accordance with the invention, the layer 39, containing N conductivity type impurities, may be formed exactly in the manner in which the doped oxide layer 23 of FIG. 2*c* is deposited. The only difference is that, since two oxide layers 39 and 43 are formed on top of the substrate 37, it is their combined thickness which should not exceed approximately 20,000 A for mechanical reasons. A suitable thickness for the first deposited layer 39 is approximately 2,000 to 4,000 A.

Turning now to the formation of the second oxide layer 43, since its function is to positively dope the substrate 37, a positive conductivity-type impurity, preferably boron, is incorporated therein. Although, of course, neither of the oxide layers 39 and 43 is conductive even though they contain conductivity-inducing impurities, the concentration of such impurities in them will be typically greater than it is in the substrate 37. The concentration of impurities in the doped oxide layers 39 and 43 are not necessarily related. What is significant is the permissible range of impurity concentration in the first oxide layer 39, this being determined according to the same criteria as was discussed with reference to the doped oxide layer 23 of FIG. 2*b*.

Incorporation of boron into the oxide layer 43 is preferably accomplished by mixing the gas diborance ($B_2H_6$) with the ingredients of a gaseous mixture used to form the oxide layer in a manner similar to that described with reference to the layer 23 of FIG. 2*b* where phosphine was the impurity vehicle.

Typical relative concentrations of nitrogen, oxygen, silane and diborane used in forming the layer 43 over the layer 39 on the substrate 37 heated to 380°C may be as follows:

| | | |
|---|---|---|
| Nitrogen: | 84 | liters per minute |
| Oxygen: | 160 | milliliters per minute |
| 10% silane by volume in nitrogen: | 175 | milliliters per minute |
| 0.1% diborane by volume in nitrogen: | 950 | milliliters per minute. |

The above gaseous mixture is made to flow over the heated substrate for approximately eight minutes resulting in a layer thickness of about 2,600 A. It is of practical importance that the boron surface concentration in the resulting diffused regions underneath the oxide layer 43 be high. Consequently, the diborane content of the gas mixture is deliberately made high. The preferred thickness of the second oxide layer 43 is between 2,000 A and 8,000 A. The upper limit is not important to the invention but the combined thickness of the layers 39 and 43 should not be greater than about 20,000 A, because of the mechanical difficulties which arise in forming the necessary metal pads over the steps created between the tops of the resulting two-oxide layer and the lower regions such as those above the source and drain regions 47 and 49 and above the gate oxide 53.

After the window 45 has been cut through the second oxide layer 43, the heating step for causing diffusion may be carried out in the same manner as described with reference to FIG. 2*c*. This, of course, will result in a simultaneous diffusion from both of the layers 39 and 43, so that the doped source and drain regions 47 and 49 will be formed at the same time that the surrounding increased-conductivity substrate field regions 51 are formed. While this is desirable, it need not necessarily be done, however. Instead, the substrate 37 may be heated before the formation of the second oxide layer 43, so as to cause the impurities from the oxide layer 39 to diffuse into the substrate. After this first diffusing step the second oxide layer 43 may be formed and then the substrate 37 may be put through another step of heating. This makes possible the achievement of different depths for the source and drain regions 47 and 49 on the one hand, and the doped field regions 51 on the other hand.

Figure 3D:
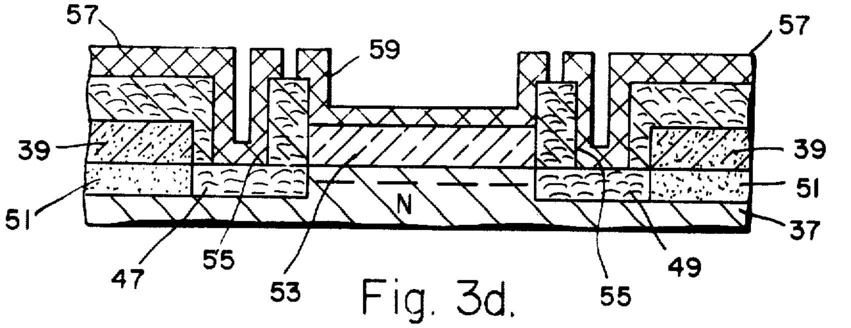

There are certain essential similarities between the processes shown in FIG. 2*a–d* and 3*a–d*. Thus, with both processes there is formed on the surface of the substrate a doped oxide layer which is contiguously adjacent to the outer borders of the positions of the source and drain regions of the respective MOS devices formed in the substrate. The two processes differ, however, in that the doped oxide layer 23 of FIG. 2*c* extends beyond the outside borders of the source and drain regions 21 and 19 and interfaces with the substrate surface containing those regions. In FIG. 3*d* on the other hand, the doped oxide layer 39 is contiguously adjacent to the outer borders of the positions of the source and drain regions without interfacing with them.

It should also be noted that the sequence in which the layers 39 and 43 are formed may be reversed from that shown in FIG. 3*a–d*. Thus, the layer 43 containing P conductivity type impurities for creating the source and drain regions may be deposited first over the appropriate areas of the substrate surface 38, and the layer 39 for increasing the conductivity of the surrounding field portions of the substrate surface may be deposited thereafter, over those portions as well as over the oxide layer 43. In such a case the oxide layer 39 will still be isolated from the positions of the source and drain regions 47 and 49 by the portions of the oxide layer 43 which in that case will be disposed between the substrate surface 38 and the oxide layer 39.

Figure 4A:
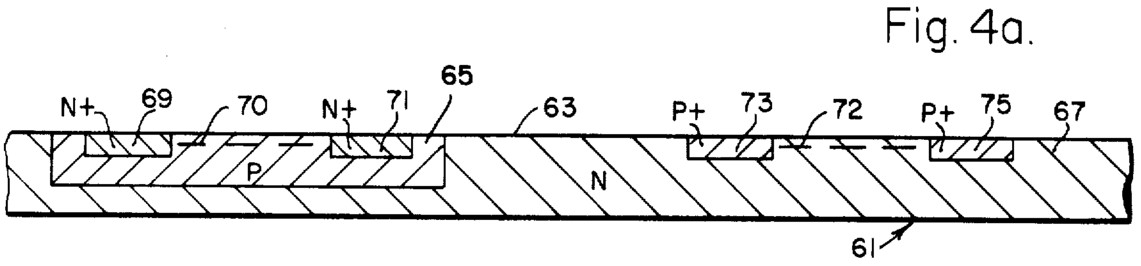
Figure 4B:
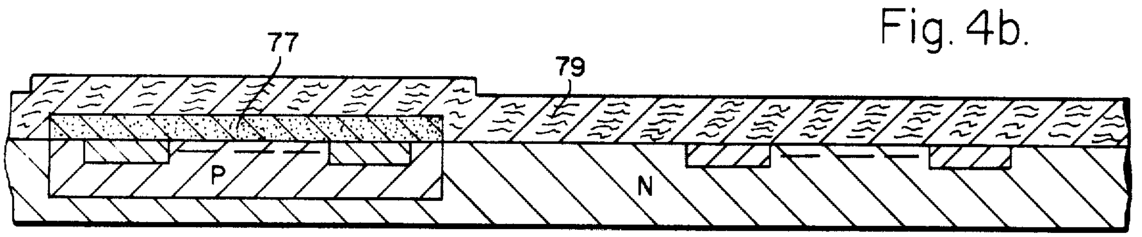

A series of steps by which the present invention may be applied to the fabrication of complementary MOS devices is illustrated in FIGS. 4*a–e*. It will again be assumed for sake of example that the devices are formed in a semiconducting substrate which is silicon doped to N-type conductivity. As shown in FIG. 4*a*, a portion of the substrate 61 is doped to acquire a P-type conductivity so that N-channel devices may be formed therein. Thus the substrate 61 comprises a P conductivity type portion 65 surrounded by the rest of the substrate which comprises an N conductivity type substrate portion 67. In the respective substrate portions 65 and 67 spaced apart source and drain regions of the proper conductivity types are formed by conventional means such as the oxide mask diffusion process illustrated in FIG. 2*a*. Thus, the P conductivity type substrate portion 65 contains spaced apart source and drain regions 69 and 71 which are typically relatively narrow strips extending into the plane of the sheet of paper and between which a channel portion 70 extends. Similarly in the substrate portion 67 there are formed a pair of spaced apart source and drain regions 73 and 75 configured similarly to the regions 69 and 71 and having between them a channel portion 72 in the substrate surface.

There is next formed on the substrate surface 63 a first oxide layer 77 which is coextensive with the P conductivity type substrate regions 65 and which serves eventually to form the increased conductivity field regions which are to surround the source and drain regions 69 and 71. Following the formation of the first oxide layer 77 which is made to include P-type impurities, there is deposited on top of the substrate surface as well as on top of the first oxide layer 77, a second oxide layer 79 containing N-type impurities and serving eventually to form the raised conductivity-type field regions which are to surround the source and drain regions 73 and 75 in the N conductivity-type portion 67 on the substrate.

Figure 4C:
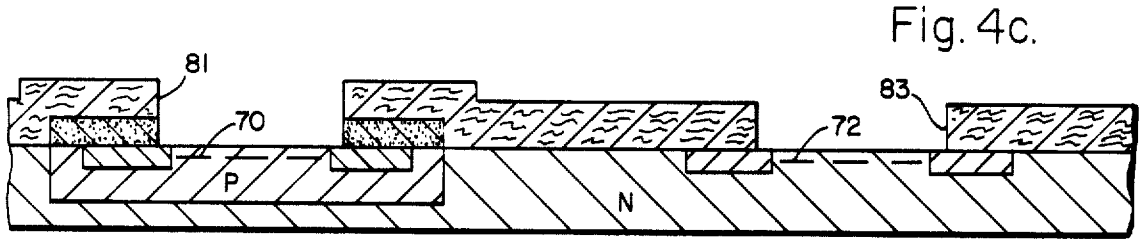
Figure 4D:
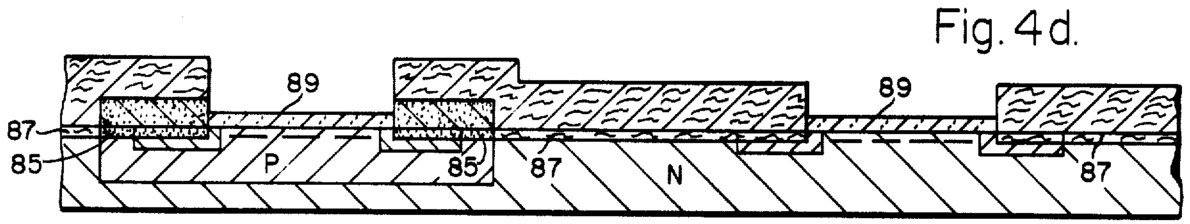
Figure 4E:
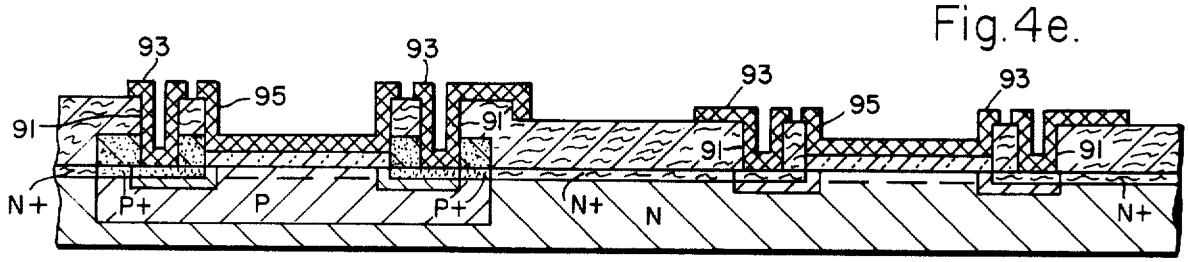

Openings 81 and 83 are next cut by conventional masking and etching steps through the oxide layers 77 and 79 to expose the channel regions 70 and 72 respectively, since further doping of these regions is to be avoided (FIG. 4*c*). The resulting oxide layer structure is seen to result in the first oxide layer 77 contiguously surrounding the positions of the source and drain regions 69 and 71, as is necessary to form the raised conductivity field regions which are to surround them. Similarly the second oxide layer 79 is seen to be contiguously adjacent to the outer borders of the positions of the source and drain regions 73 and 75. In the cases of both of the layers 77 and 79 it is seen that they interface with the source and drain regions which they surround. However, as explained with reference to FIGS. 2*a–d*, the resulting counter-doping which will occur can in most cases be tolerated because of the sufficiently high doping of the source and drain regions.

With the doped oxide layers 77 and 79 properly patterned, the substrate 61 is heated, thereby causing the impurities from the first oxide layer 77 to diffuse into the P conductivity-type substrate portion 65, causing the inconsequential counterdoping of the source and drain regions 69 and 71 and the desired additional doping of the surrounding substrate portions 85 (FIG. 2*d*). At the same time diffusion of impurities also occurs from the second oxide layer 79 into the N conductivity-type substrate portion 67, again causing inconsequential counterdoping of the source and drain regions 73 and 75 and the desired increased doping of the surrounding substrate regions 87. Again, heating may be accomplished so as to concurrently form gate oxide layers 89 over the channel regions 70 and 72.

The concluding step of the process is to cut contact openings 91 through the oxide layers 77 and 79 and to then form a metal layer on top of the second oxide layer 79, separating sections of the metal layer into contacts 93 which extend to engage the source and drain regions 69, 71, 73 and 75 through the openings 91, and gate electrodes 95 which extend into contact with the gate oxide layers 89.

Figure 5A:
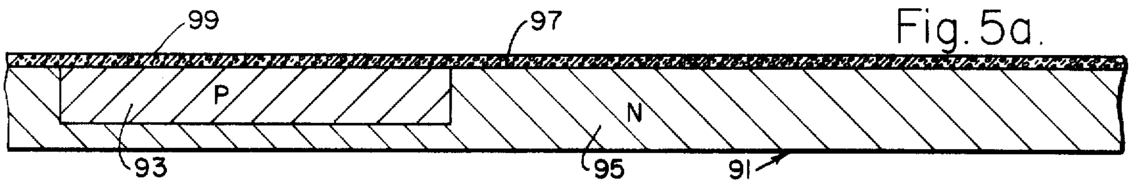
Figure 5B:
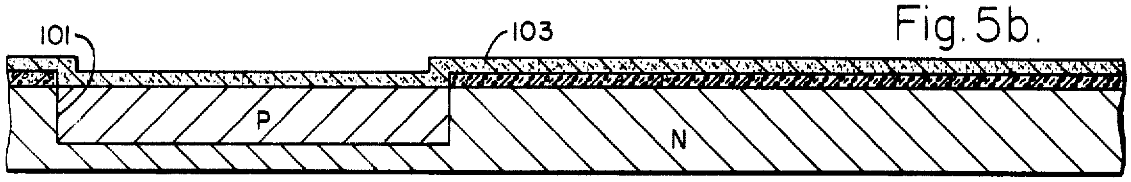

The manner in which the oxide layers 77 and 79 are formed may be the same as that described respectively for forming the oxide layers 39 and 43 with reference to FIG. 3*b*. However, in order to prevent premature junction breakdown, the diborane concentration used in forming the oxide layer 77 must be reduced. A second process for fabricating complementary MOS devices in accordance with the present invention is illustrated in FIGS. 5*a–f*. It is related to the process of FIGS. 4*a–e* in the same way in which the process of FIGS. 3*a–b* is related to the process of FIGS. 2*a–d*. In other words, whereas in the steps illustrated in FIGS. 4*a–e* there is one doped oxide layer used for each given type of MOS device, and is used only to form the field regions surrounding that device, in the steps shown in FIGS. 5*a–f* two doped oxide layers are used for each conductivity type MOS device, one layer being used to form the source and drain regions, and the second layer being used to create the surrounding increased conductivity field regions in the substrate. The process begins in FIG. 5*a* with a substrate 91 labeled for sake of specificity as doped to have N-type conductivity and having formed therein by any conventional means a P conductivity-type region 93 which is surrounded by the remaining N conductivity-type portion 95 of the substrate. There is next formed on the surface 97 of the substrate 91 a first oxide layer 99 containing impurities of the same conductivity type as that of the substrate portion 95 (N-type impurities, since the function of the layer 99 will be to form the increased conductivity field regions in that portion of the substrate). An opening 101 is next formed by conventional means through the oxide layer 99 and coextensive with the substrate portion 93 so as to expose that portion to the oxide layer 103 which is formed next and whose function is to eventually create the raised-conductivity field regions in the P substrate portion 93 (FIG. 5*b*). Hence the second formed oxide layer 103 contains P conductivity-type impurities.

Figure 5C:
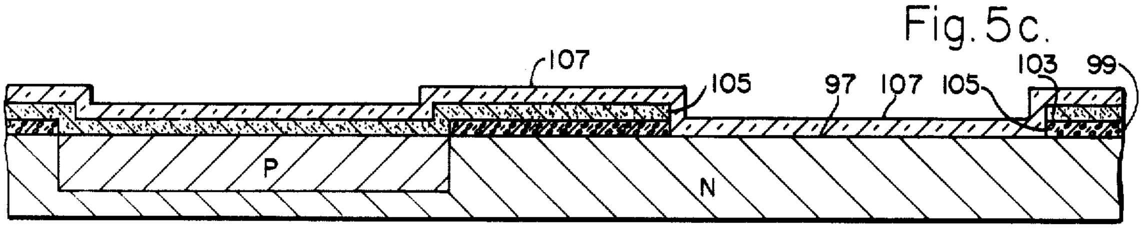

A second opening 105 is next etched through the first two oxide layers 99 and 103 to the N conductivity type portion 95 of the substrate 91 (FIG. 5*c*). The opening 105 is typically a rectangularly shaped window corresponding to the outer borders of the source and drain regions which are to be formed in that portion of the substrate by the oxide layer 107. Since the source and drain regions will be of the P conductivity-type, this will be the type of impurity contained in the layer 107 which is next formed and which extends over the second oxide layer 103 and, within the opening 105, along the exposed surface 97 of the substrate.

Figure 5D:
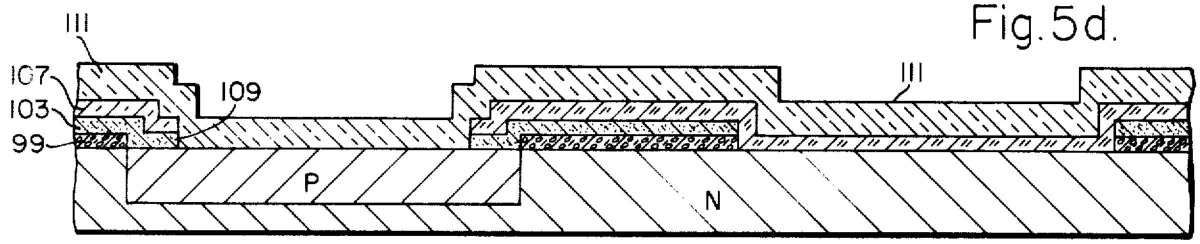

In preparation for the deposition of the next, and fourth oxide layer 111, an opening 109 is cut through the second and third oxide layers 103 and 107 so as to expose the central portion of the P conductivity type substrate portion 93. Similar to the opening 105, the opening 109 is a generally rectangularly shaped window whose sides serve to define the outer borders of the source and drain regions which are to be formed thereunder in the substrate portion 93. The fourth doped oxide layer 111 is then deposited as shown in FIG. 5*d*.

Figure 5E:
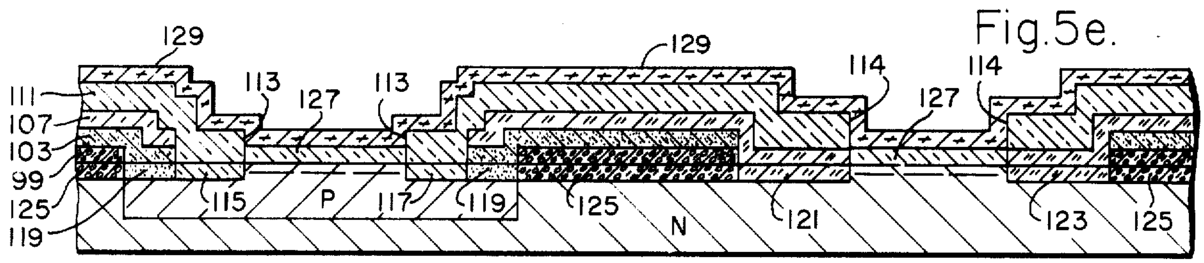
Figure 5F:
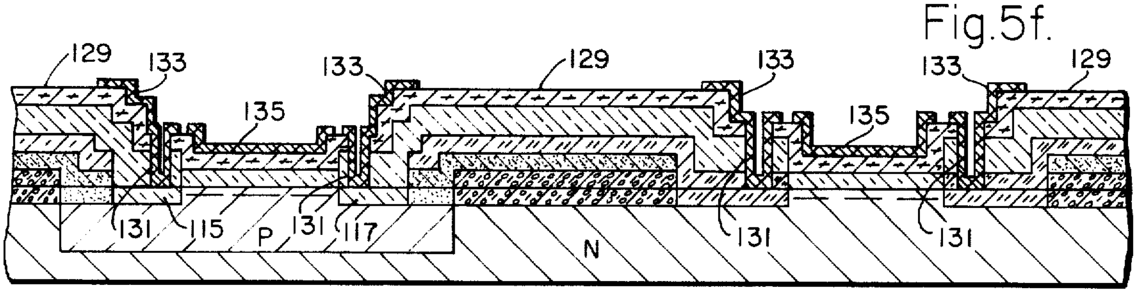

With all four doped oxide layers 99, 103, 107 and 111 formed, an opening 113 is cut through the fourth oxide layer 111 so as to remove that layer from above the channel region which is to exist in the substrate portion 93 and which region is not to be doped further (FIG. 5*e*). Similarly, an opening 114 is cut through the third and fourth oxide layers 107 and 111 in order to remove both of the layers from above the channel region which is to be formed in the substrate portion 95 and which is also to be left free of further doping. The substrate 91 with the four doped oxide layers properly patterned is now heated, thereby causing impurities from all four of the oxide layers 93, 103, 107 and 111 simultaneously to diffuse into the substrate portions 93 and 95. Thus, during this heating step, source and drain regions 115 and 117 are formed by impurities from the fourth oxide layer 111 and the surrounding portions 119 of the P conductivity-type substrate 93 are additionally doped by impurities from the second oxide layer 103. At the same time, P conductivity-type source and drain regions 121 and 123 are formed in the substrate portion 95 by impurities diffusing from the third oxide layer 107, and the surrounding portions 125 of the substrate region 95 are additionally doped with N conductivity-type impurities from the first formed oxide layer 99. Again preferably but not necessarily, the heating step is carried out in an oxidizing atmosphere, thereby simultaneously growing during the diffusion step the thermal oxide layers 127 above the channel regions which extend between the respective pairs of source and drain regions 115, 117 and 121, 123.

In each of the three previously described series of steps a passivating layer such as silicon nitride might have been conventionally formed just prior to the deposition of the metal layer fromwhich the contacts and gate electrodes were shown to have been formed. Such a layer 129 is shown as being deposited next in FIG. 5*e*, although again such a step is optional. When used, such a layer is typically of the order of 300 A thick.

Formation of the necessary contacts and gate electrodes concludes the process and includes the cutting of openings 131 to expose the source and drain regions 115, 117, 121 and 123 followed by the deposition of a metal layer which is then separated to define contacts 133 and gate electrodes 135.

Further detailed information concerning the manner of forming the four doped oxide layers 99, 103, 107 and 111 is not required, since each of them may be formed in the same manner as was described for the oxide layers containing corresponding impurity types with reference to the preceding figures. Naturally, with the larger number of stacked oxide layers the thicknesses of the individual layers should be less, in order that the total thickness of the oxide layers where the contact metal is stepped between the source and drain regions and the top of the oxide layers not to exceed approximately 20,000A.

What is claimed is:

1. A method of treating an MISFET device comprising the steps of:

a. forming directly on a surface of a first conductivity type semiconducting substrate first and second oxide layers respectively interfacing with first and second regions of said surface and respectively containing second and first conductivity type impurities, said first region being contiguously surrounded by said second region and itself including a pair of spaced apart areas between which said surface is free of both of said layers; and b. raising the temperature of said substrate and of said layers thereon so as to diffuse the impurities from said first layer into said spaced apart areas, thereby forming second conductivity type source and drain regions therein and so as to simultaneously diffuse the impurities from said second layer into said surrounding second region, thereby forming increased first conductivity type field regions therein, without thereby doping said channel region.

2. A method of treating an MOSFET device the steps of:

a. forming a pair of spaced apart source and drain regions in a semiconducting substrate, said substrate and said regions being doped to have first and second conductivity types respectively;

b. forming an oxide layer directly on said surface, said oxide layer containing impurities of the same conductivity type as said substrate, extending onto and interfacing with said source and drain regions, but leaving exposed the substrate surface which extends between said regions; and c. diffusing said impurities from said first named layer into said substrate by heating said substrate and said oxide layer, without thereby doping said exposed substrate surface.

3. A method of treating a complementary MOSFET device having first and second conductivity type portions disposed in a semiconducting substrate along a common surface thereof, with respective portions containing pairs of source and drain regions at spaced apart positions and of a conductivity type opposite that of said respective portions, the steps of:

a. forming directly on said surface first and second oxide layers, said first layer containing a first conductivity type portion and overlapping the outer borders of the positions of the source and drain regions therein while leaving the substrate surface between said positions exposed, said second layer containing second conductivity type impurity and extending over said second conductivity type portion and overlapping the outer borders of the positions of the source and drain regions therein while leaving the substrate surface between said positions exposed; and b. heating said substrate and said layers so as to diffuse impurities from said layers into the said substrate surface directly under then, without thereby doping said exposed substrate surface.

4. The method of claim 3 characterized further in that:

a. said oxide layers are formed in succession, one on top of the other, with the first formed layer extending only over its respective substrate portion and the second formed layer extending substantially along the entire substrate surface; and b. openings are formed through said oxide layers before said heating step so as to remove said layers from said substrate surface between the respective source and drain regions.

5. A method of treating a complementary MOSFET device in a semiconducting substrate having first and second conductivity type portions disposed along a common surface thereof, the steps of:

a. forming a pattern of oxide layers directly on said surface, said pattern including first and second oxide layers over said first and second conductivity type portions respectively upon said surface, said layers containing second and first conductivity type impurities respectively and each layer comprising two spaced apart portions between which the substrate surface is exposed, a third oxide layer containing a first conductivity type impurity over said first conductivity type substrate portion, contiguously to and surrounded by said first oxide layer, and a fourth oxide layer containing a second conductivity type impurity over said second substrate portion, contiguously to and surrounded by said second oxide layer; and b. heating said substrate and the layers thereon so as to cause the impurities from said layers to diffuse into said substrate surface so as to create therein respective source and drain pairs under said third and fourth oxide layers, surrounded by respective doped field regions under said first and second oxide layers, without thereby doping said exposed substrate surface.

* * * * *